US012615997B2

(12) United States Patent
Bergantz et al.

(10) Patent No.: US 12,615,997 B2
(45) Date of Patent: *Apr. 28, 2026

(54) CALIBRATION OF AN ALIGNER STATION OF A PROCESSING SYSTEM

(71) Applicant: APPLIED MATERIALS, INC., Santa Clara, CA (US)

(72) Inventors: Nicholas Michael Bergantz, San Jose, CA (US); Andreas Schmid, Sunnyvale, CA (US); Leon Volfovski, Mountain View, CA (US); Sanggyum Kim, Sunnyvale, CA (US); Damon Cox, Jarrell, TX (US); Paul Wirth, Kalispel, MT (US)

(73) Assignee: Applied Materials, Inc., Santa Clara, CA (US)

( * ) Notice: Subject to any disclaimer, the term of this patent is extended or adjusted under 35 U.S.C. 154(b) by 334 days.

This patent is subject to a terminal disclaimer.

(21) Appl. No.: 18/476,223

(22) Filed: Sep. 27, 2023

(65) Prior Publication Data

US 2024/0021458 A1     Jan. 18, 2024

Related U.S. Application Data

(63) Continuation of application No. 16/990,839, filed on Aug. 11, 2020, now Pat. No. 11,823,937.

(Continued)

(51) Int. Cl.
*H01L 21/68* (2006.01)
*B25J 9/16* (2006.01)
(Continued)

(52) U.S. Cl.
CPC .......... *H01L 21/681* (2013.01); *B25J 9/1692* (2013.01); *B25J 11/0095* (2013.01);
(Continued)

(58) Field of Classification Search
CPC ...................... H01L 21/681; H01L 21/67259; B25J 9/1692; B25J 11/0095
See application file for complete search history.

(56) References Cited

U.S. PATENT DOCUMENTS

| | | |
|---|---|---|
| 3,709,608 A | 1/1973 | Degnan et al. |
| 5,934,856 A | 8/1999 | Asakawa et al. |
| | (Continued) | |

FOREIGN PATENT DOCUMENTS

| | | |
|---|---|---|
| CN | 2726109 Y | 9/2005 |
| EP | 1083424 A2 | 3/2001 |
| | (Continued) | |

OTHER PUBLICATIONS

International Search Report and Written Opinion for International application No. PCT/US2020/046852 dated Nov. 26, 2020, 17 pages.

(Continued)

*Primary Examiner* — Gerald McClain
(74) *Attorney, Agent, or Firm* — Lowenstein Sandler LLP

(57) ABSTRACT

A calibration object is transferred from a processing chamber to an aligner station by one or more robot arms. The calibration object has a first processing chamber orientation in the processing chamber and a second orientation at the aligner station. A first characteristic error value associated with a transfer path between the processing chamber and the aligner is determined based on the first processing chamber orientation and the second orientation of the calibration object at the aligner station. In response to detecting an object at the aligner station to be transferred to the processing chamber along the transfer path, the object is aligned by the aligner station to be placed in the processing chamber according to a target processing chamber orientation based on a target aligner orientation as adjusted by the first (Continued)

characteristic error value determined for the transfer path between the processing chamber and the aligner station.

17 Claims, 8 Drawing Sheets

Related U.S. Application Data

(60) Provisional application No. 62/888,929, filed on Aug. 19, 2019.

(51) Int. Cl.
  *B25J 11/00*    (2006.01)
  *H01L 21/67*    (2006.01)
  *H01L 21/687*    (2006.01)

(52) U.S. Cl.
  CPC .. *H01L 21/67196* (2013.01); *H01L 21/67201* (2013.01); *H01L 21/67259* (2013.01); *H01L 21/68707* (2013.01)

(56) References Cited

U.S. PATENT DOCUMENTS

| | | | |
|---|---|---|---|
| 6,375,748 | B1 | 4/2002 | Yudovsky et al. |
| 6,395,094 | B1 | 5/2002 | Tanaka et al. |
| 6,463,782 | B1 | 10/2002 | Shen et al. |
| 8,185,242 | B2 | 5/2012 | Wong et al. |
| 8,489,237 | B2 | 7/2013 | Gage et al. |
| 8,509,938 | B2 | 8/2013 | Krupyshev |
| 8,954,287 | B2 | 2/2015 | Rodnick et al. |
| 9,075,411 | B2 | 7/2015 | Aiso |
| 9,281,222 | B2 | 3/2016 | Weaver et al. |
| 9,735,039 | B2 | 8/2017 | Hwang et al. |
| 10,134,623 | B2 | 11/2018 | Mn et al. |
| 10,541,168 | B2 | 1/2020 | Tan et al. |
| 10,710,819 | B1 | 7/2020 | Thanu et al. |
| 11,823,937 | B2 * | 11/2023 | Bergantz .......... H01L 21/67259 |
| 2003/0186563 | A1 | 10/2003 | Kobayashi et al. |
| 2004/0249595 | A1 | 12/2004 | Vermeer et al. |
| 2005/0004697 | A1 | 1/2005 | Krupyshev |
| 2005/0255609 | A1 * | 11/2005 | Kumagai ................ H01L 21/68 |
| | | | 438/5 |
| 2007/0276533 | A1 | 11/2007 | Machiyama |
| 2009/0259337 | A1 | 10/2009 | Harrold et al. |
| 2010/0008688 | A1 | 1/2010 | Kimura |
| 2012/0136471 | A1 * | 5/2012 | Krupyshev .......... H01L 21/682 |
| | | | 700/112 |
| 2017/0115657 | A1 | 4/2017 | Trussell et al. |
| 2018/0269088 | A1 | 9/2018 | Nozawa |
| 2019/0109031 | A1 | 4/2019 | Sugawara |
| 2019/0172738 | A1 | 6/2019 | Hiester et al. |
| 2019/0172742 | A1 | 6/2019 | Mochizuki |
| 2019/0252234 | A1 | 8/2019 | Genetti et al. |
| 2021/0057256 | A1 | 2/2021 | Bergantz et al. |
| 2021/0125849 | A1 | 4/2021 | Finkelman et al. |
| 2021/0291374 | A1 | 9/2021 | Bergantz et al. |
| 2021/0291375 | A1 | 9/2021 | Bergantz et al. |

FOREIGN PATENT DOCUMENTS

| | | | |
|---|---|---|---|
| JP | 2002118162 | A | 4/2002 |
| JP | 2004047911 | A | 2/2004 |
| JP | 2004174669 | A | 6/2004 |
| JP | 2008078210 | A | 4/2008 |
| JP | 2008173744 | A | 7/2008 |
| JP | 2011054933 | A | 3/2011 |
| JP | 2012216614 | A | 11/2012 |
| JP | 2014150104 | A | 8/2014 |
| JP | 2018010992 | A | 1/2018 |
| JP | 2019102728 | A | 6/2019 |
| KR | 10-0563092 | B1 | 3/2006 |
| KR | 20190067105 | A | 6/2019 |
| TW | 201806064 | A | 2/2018 |

OTHER PUBLICATIONS

International Search Report and Written Opinion for International application No. PCT/US2021/022616 dated Jul. 12, 2021, 15 pages.

* cited by examiner

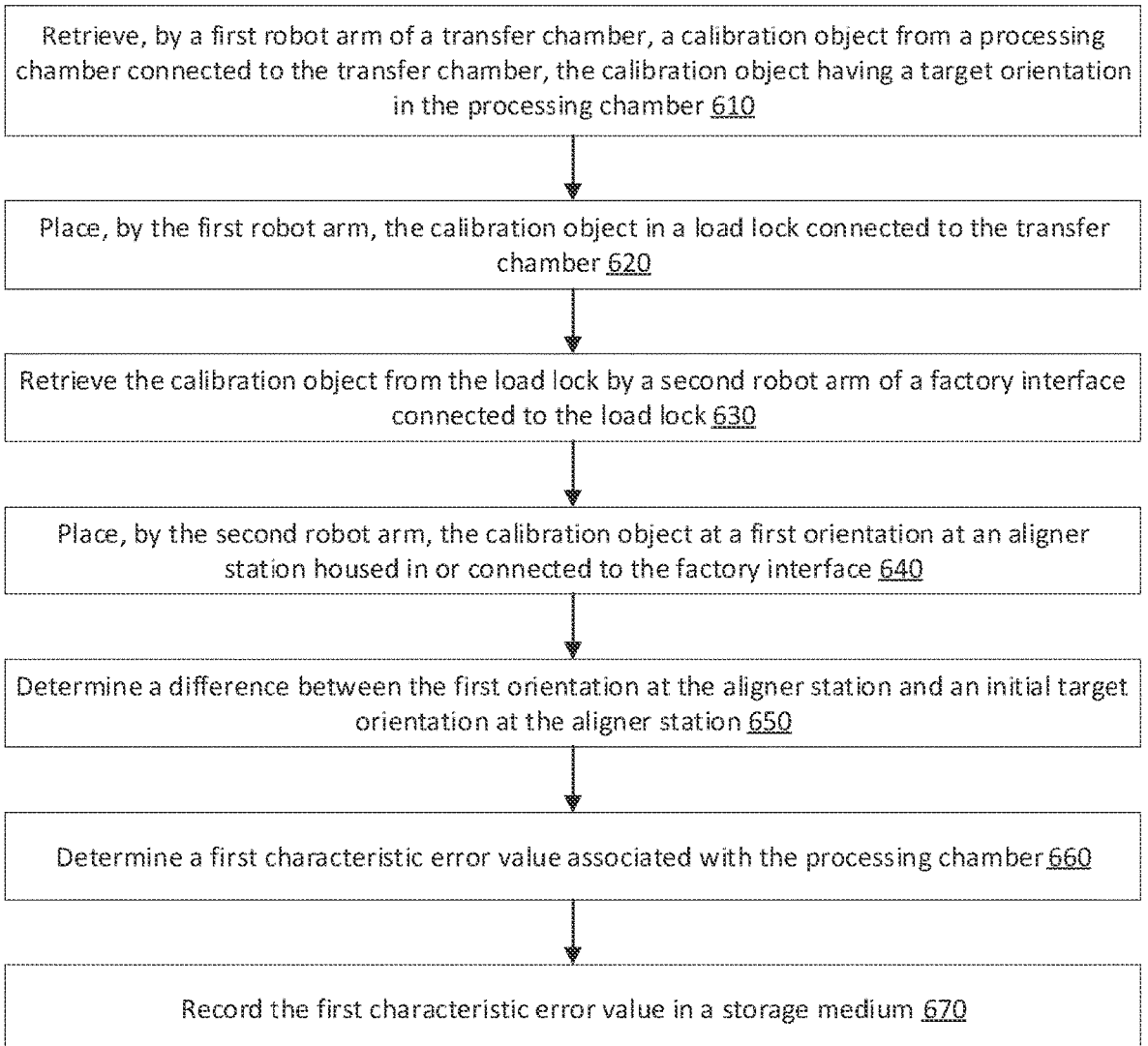

Retrieve, by a first robot arm of a transfer chamber, a calibration object from a processing chamber connected to the transfer chamber, the calibration object having a target orientation in the processing chamber 610

Place, by the first robot arm, the calibration object in a load lock connected to the transfer chamber 620

Retrieve the calibration object from the load lock by a second robot arm of a factory interface connected to the load lock 630

Place, by the second robot arm, the calibration object at a first orientation at an aligner station housed in or connected to the factory interface 640

Determine a difference between the first orientation at the aligner station and an initial target orientation at the aligner station 650

Determine a first characteristic error value associated with the processing chamber 660

Record the first characteristic error value in a storage medium 670

FIG. 6

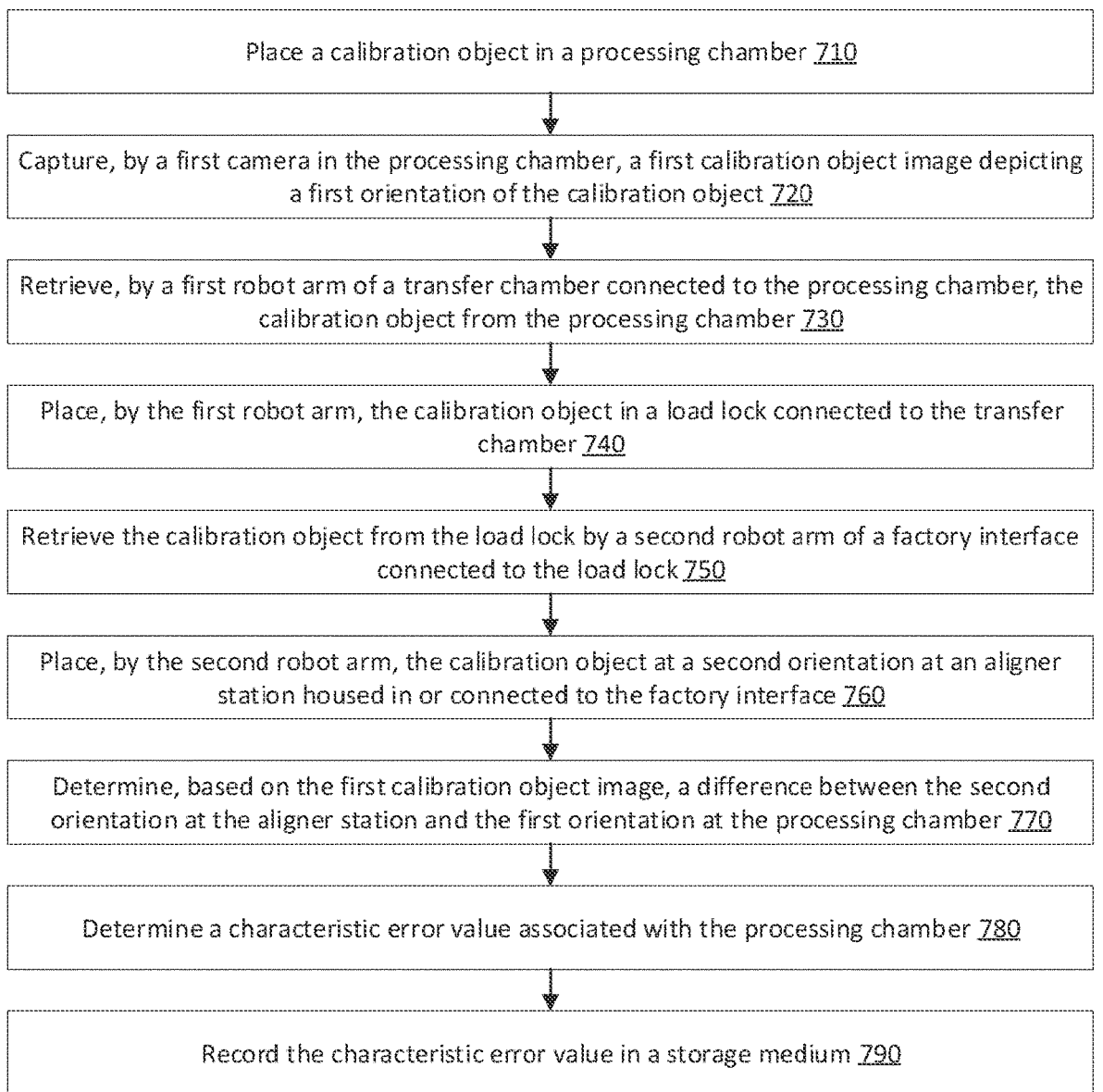

Place a calibration object in a processing chamber 710

Capture, by a first camera in the processing chamber, a first calibration object image depicting a first orientation of the calibration object 720

Retrieve, by a first robot arm of a transfer chamber connected to the processing chamber, the calibration object from the processing chamber 730

Place, by the first robot arm, the calibration object in a load lock connected to the transfer chamber 740

Retrieve the calibration object from the load lock by a second robot arm of a factory interface connected to the load lock 750

Place, by the second robot arm, the calibration object at a second orientation at an aligner station housed in or connected to the factory interface 760

Determine, based on the first calibration object image, a difference between the second orientation at the aligner station and the first orientation at the processing chamber 770

Determine a characteristic error value associated with the processing chamber 780

Record the characteristic error value in a storage medium 790

FIG. 7

CALIBRATION OF AN ALIGNER STATION OF A PROCESSING SYSTEM

RELATED APPLICATIONS

This application is a continuation application of, and claims priority to U.S. patent application Ser. No. 16/990, 839, filed Aug. 11, 2020, which claims priority to and the benefit under 35 U.S.C. § 119(e) of U.S. Provisional Patent Application No. 62/888,929, filed Aug. 19, 2019, each of which is hereby incorporated by reference herein, in its entirety, by this reference.

TECHNICAL FIELD

Embodiments of the present disclosure relate, in general, to methods and systems for calibrating an aligner station of an electronics processing system.

BACKGROUND

An electronics processing system may include one or more robot arms for transporting a substrate from a first station of the electronics processing system to a second station of the electronics processing system. In electronics processing systems, a substrate or an object is to be moved from the first station and placed at a target orientation at the second station. Frequently, one or more system errors associated with the first station and/or the second station may prevent the robot arm from placing the substrate or the object at the target orientation at the second station. For example, the electronics processing system may include an aligner station and a processing chamber, where a substrate or object may be retrieved from the aligner station by a robot arm for transfer to the processing chamber at a target orientation. The aligner station and/or the processing chamber may be associated with a characteristic error resulting from a variety of sources (e.g., the aligner station and/or the processing chamber was not installed properly during construction of the processing system, small errors in robot arm positioning and/or orientation, etc.). Accordingly, when the substrate or object is transferred from the aligner station and ultimately to the processing chamber, the substrate or object may have a small error in orientation and/or positioning.

SUMMARY

Some of the embodiments described cover a method including retrieving, by a first robot arm of a transfer chamber, a calibration object from a processing chamber connected to the transfer chamber. The calibration object has a target orientation in the processing chamber. The method further includes placing, by the first robot arm, the calibration object in a load lock connected to the transfer chamber. The method further includes retrieving the calibration object from the load lock by a second robot arm of a factory interface connected to the load lock. The method further includes placing, by the second robot arm, the calibration object at an aligner station housed in or connected to the factory interface. The calibration object has a first orientation at the aligner station. The method further includes determining a difference between the first orientation at the aligner station and an initial target orientation at the aligner station. The initial target orientation at the aligner station is associated with the target orientation in the processing chamber. The method further includes determining a characteristic error value associated with the processing chamber based on the difference between the first orientation and the initial target orientation. The method further includes recording the characteristic error value in a storage medium. The aligner station is to use the characteristic error value for alignment of objects to be placed in the processing chamber.

In some embodiments, a method includes placing a calibration object in a processing chamber. The method further includes capturing, by a first camera at the processing chamber, a first calibration object image depicting the first orientation of the calibration object in the processing chamber. The method further includes retrieving, by a first robot arm of a transfer chamber connected to the processing chamber, the calibration object from the processing chamber. The method further includes placing, by the first robot arm, the calibration object in a load lock connected to the transfer chamber. The method further includes retrieving the calibration object from the load lock by a second robot arm of a factory interface connected to the load lock. The method further includes placing, by the second robot arm, the calibration object at an aligner station housed in or connected to the factory interface. The calibration object has a second orientation at the aligner station. The method further includes determining, based on the second orientation and the first orientation depicted in the first calibration object image, a characteristic error value associated with the processing chamber based on the difference between the first orientation and the initial target orientation. The method further includes recording the characteristic error value in a storage medium. The aligner is to use the characteristic error value for alignment of objects to be placed in the processing chamber.

In some embodiments, an electronics processing system includes a transfer chamber including a first robot arm, a set of one or more processing chambers connected to the transfer chamber, a load lock connected to the transfer chamber, a factory interface connected to the load lock including a second robot arm and an aligner station, and a controller operatively connected to the first robot arm, the second robot arm and the aligner station. The controller is to cause the second robot arm to pick up a process kit ring from a storage location and place the process kit ring at the aligner station. The controller is further to determine that the process kit ring is to be placed at a first processing chamber of a set of processing chambers. The controller is further to cause the process kit ring to be aligned, at the aligner station, using a first characteristic error value associated with the first processing chamber. The aligner station is to align the process kit ring to a corrected target orientation that is based on an initial target orientation as adjusted by the first characteristic error value. The controller is further to cause the second robot arm to pick up the first process kit ring from the aligner and place the first process kit ring in the load lock. The controller is further to cause the first robot arm to pick up the first process kit ring from the load lock and place the first process kit ring in the first processing chamber. The first process kit ring placed in the processing chamber approximately has a target orientation in the first processing chamber.

BRIEF DESCRIPTION OF THE DRAWINGS

The present disclosure is illustrated by way of example, and not by way of limitation, in the figures of the accompanying drawings in which like references indicate similar elements. It should be noted that different references to "an"

or "one" embodiment in this disclosure are not necessarily to the same embodiment, and such references mean at least one.

FIG. 6 is a method for calibrating an aligner station of an electronic processing system, according to embodiments of the present disclosure.

FIG. 7 is another method for calibrating an aligner station of an electronic processing system, according to embodiments of the present disclosure.

DETAILED DESCRIPTION OF EMBODIMENTS

Figure 1:
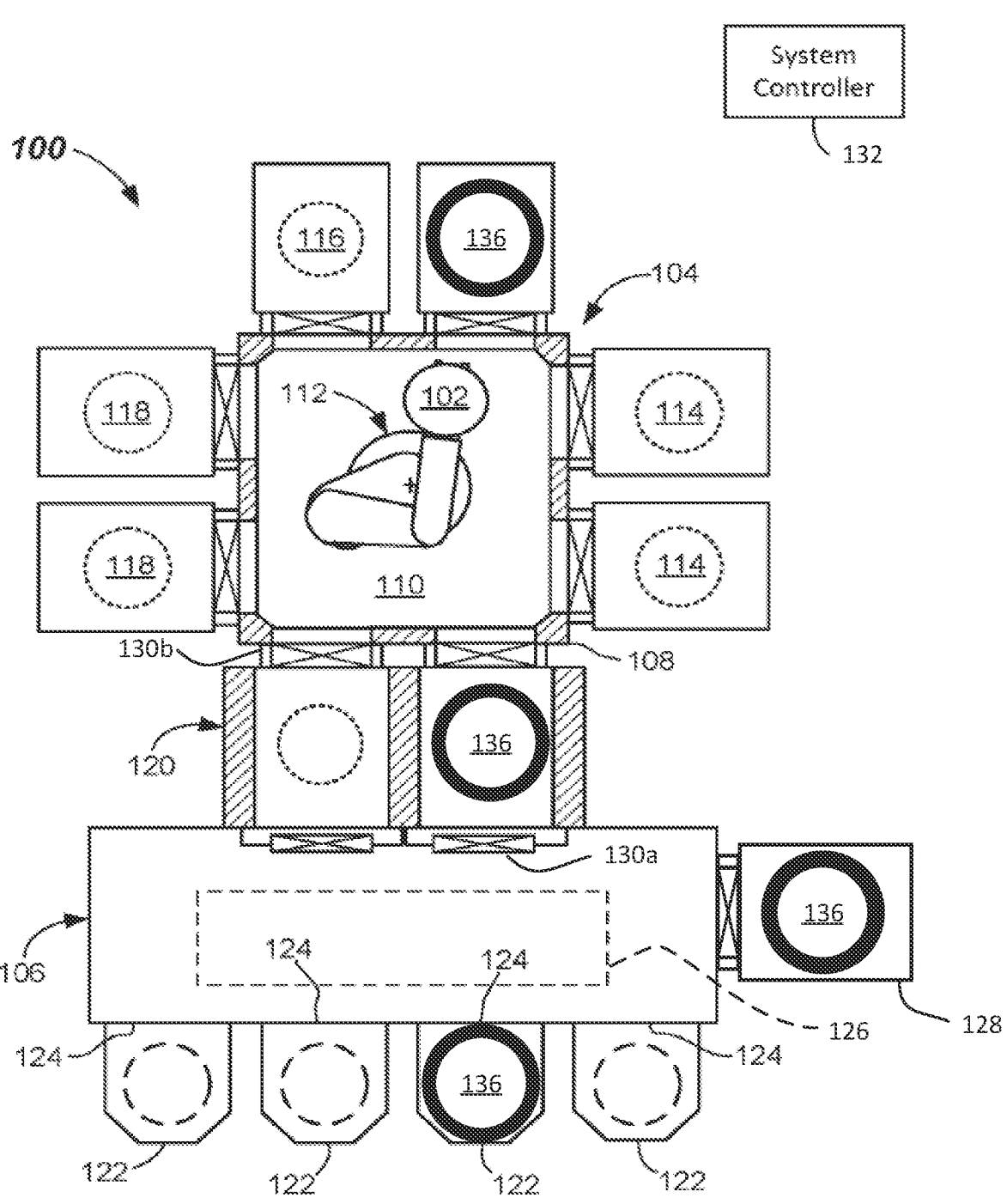
FIG. 1 is a top schematic view of an example electronic processing system, according to aspects of the present disclosure.

Embodiments described herein are related to methods and systems for calibrating an aligner station of an electronic processing system. A calibration object, such as a calibration ring, a process kit ring or a calibration wafer, is used to determine a characteristic error value associated with a processing chamber of the electronics processing system. In some embodiments, the calibration object may be placed at the processing chamber at a target orientation. A first robot arm of a first robot may retrieve the calibration object and place the calibration object at a load lock of the electronics processing system. The calibration object may be retrieved, by a second robot arm of a second robot, from the load lock and placed at a first orientation at an aligner station of the electronics processing system. A difference between the first orientation and an initial target orientation may be determined.

A characteristic error value associated with the processing chamber may be determined based on the difference between the first orientation and the initial target orientation. The characteristic error value may be stored at a storage medium. After the characteristic error value is determined and stored at the storage medium, an object may be received at the aligner station to be processed at the processing chamber. The characteristic error value associated with the processing chamber may be retrieved from the storage medium and the object may be aligned to the initial target orientation based on the characteristic error value.

In some embodiments, a first camera of the processing chamber may capture a first calibration object image prior to the calibration object while the calibration object is disposed in the process chamber. In response to the calibration object being placed at the aligner station, a second camera of the aligner station may capture a second calibration object image. The first calibration object image and the second calibration object image may be processed to determine characteristic error associated with the process chamber. The characteristic error may indicate a difference between a target orientation in the process chamber and an actual orientation that objects will have if they are aligned to the initial target orientation at the aligner station.

By calibrating the aligner station using a calibration object as described in embodiments herein prior to placing objects (e.g., replaceable parts or components of the process chamber such as a process kit ring) in the processing chamber, a likelihood that each object will be positioned at a target orientation at the processing chamber increases. By increasing the likelihood that each object will be positioned at the target orientation, a number of alignment operations to be performed at the processing chamber is reduced, decreasing overall system latency. Additionally, the accuracy of the orientation (e.g., yaw) of placed objects is dramatically improved over conventional systems in embodiments, with an orientation accuracy as high +/−0.00001°. Similarly, by reducing the number of alignment operations to be performed at the processing chamber, a likelihood that the object, or a robot arm placing the object at the processing chamber, will be damaged as a result of an incorrect x-axis, y-axis, or yaw-axis motion decreases. Additionally, the amount of time that it takes to properly insert new replaceable parts (e.g., process kit rings) into processing chambers may be reduced in embodiments by ensuring that the parts are inserted at a proper orientation on a first attempt.

FIG. 1 is a top schematic view of an example electronics processing system 100, according to one aspect of the disclosure. Electronics processing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon.

Electronics processing system 100 may include a process tool 104 and a factory interface 106 coupled to process tool 104. Process tool 104 may include a housing 108 having a transfer chamber 110 therein. Transfer chamber 110 may include one or more processing chambers (also referred to as process chambers) 114, 116, 118 disposed therearound and coupled thereto. Processing chambers 114, 116, 118 may be coupled to transfer chamber 110 through respective ports, such as slit valves or the like.

Processing chambers 114, 116, 118 may be adapted to carry out any number of processes on substrates 102. A same or different substrate process may take place in each processing chamber 114, 116, 118. A substrate process may include atomic layer deposition (ALD), physical vapor deposition (PVD), chemical vapor deposition (CVD), etching, annealing, curing, pre-cleaning, metal or metal oxide removal, or the like. In one example, a PVD process may be performed in one or both of process chambers 114, an etching process may be performed in one or both of process chambers 116, and an annealing process may be performed in one or both of process chambers 118. Other processes may be carried out on substrates therein. Processing chambers 114, 116, 118 may each include a substrate support assembly. The substrate support assembly may be configured to hold a substrate in place while a substrate process is performed.

As described above, an etching process may be performed at one or more processing chambers 114, 116, 118. As such, some processing chambers 114, 116, 118 (such as etch chambers) may include edge rings (also referred to as process kit rings) 136 that are placed at a surface of the substrate support assembly. In some embodiments, the process kit rings may occasionally undergo replacement. While replacement of process kit rings in conventional system includes disassembly of a processing chamber 114, 116, 118 by an operator to replace the process kit ring, electronics processing system 100 may be configured to facilitate replacement of process kit rings without disassembly of a processing chamber 114, 116, 118 by an operator.

In some embodiments, processing chambers 114, 116, 118 may include at least one of a heating or a cooling element displaced therein. A heating element may be configured to increase a temperature of an interior of a processing chamber. A cooling element may be configured to decrease a temperature of the interior of the processing chamber. In some embodiments, the heating element and the cooling element may be the same element.

Transfer chamber 110 may also include a transfer chamber robot 112. Transfer chamber robot 112 may include one or multiple arms where each arm includes one or more end effectors at the end of each arm. The end effector may be configured to handle particular objects, such as wafers. Alternatively, or additionally, the end effector may be configured to handle objects such as process kit rings. In some embodiments, transfer chamber robot 112 may be a selective compliance assembly robot arm (SCARA) robot, such as a 2 link SCARA robot, a 3 link SCARA robot, a 4 link SCARA robot, and so on.

A load lock 120 may also be coupled to housing 108 and transfer chamber 110. Load lock 120 may be configured to interface with, and be coupled to, transfer chamber 110 on one side and factory interface 106. Load lock 120 may have an environmentally-controlled atmosphere that may be changed from a vacuum environment (wherein substrates may be transferred to and from transfer chamber 110) to an at or near atmospheric-pressure inert-gas environment (wherein substrates may be transferred to and from factory interface 106) in some embodiments. In some embodiments, load lock 120 may be a stacked load lock having a pair of upper interior chambers and a pair of lower interior chambers that are located at different vertical levels (e.g., one above another). In some embodiments, the pair of upper interior chambers may be configured to receive processed substrates from transfer chamber 110 for removal from process tool 104, while the pair of lower interior chambers may be configured to receive substrates from factory interface 106 for processing in process tool 104. In some embodiments, load lock 120 may be configured to perform a substrate process (e.g., an etch or a pre-clean) on one or more substrates 102 received therein.

Factory interface 106 may be any suitable enclosure, such as, e.g., an Equipment Front End Module (EFEM). Factory interface 106 may be configured to receive substrates 102 from substrate carriers 122 (e.g., Front Opening Unified Pods (FOUPs)) docked at various load ports 124 of factory interface 106. A factory interface robot 126 (shown dotted) may be configured to transfer substrates 102 between substrate carriers (also referred to as containers) 122 and load lock 120. Factory interface robot 126 may include one or more robot arms and may be or include a SCARA robot. In some embodiments, factory interface robot 126 may have more links and/or more degrees of freedom than transfer chamber robot 112. Factory interface robot 126 may include an end effector on an end of each robot arm. The end effector may be configured to pick up and handle specific objects, such as wafers. Alternatively, or additionally, the end effector may be configured to handle objects such as process kit rings.

Any conventional robot type may be used for factory interface robot 126. Transfers may be carried out in any order or direction. Factory interface 106 may be maintained in, e.g., a slightly positive-pressure non-reactive gas environment (using, e.g., nitrogen as the non-reactive gas) in some embodiments.

In some embodiments, transfer chamber 110, process chambers 114, 116, and 118, and load lock 120 may be maintained at a vacuum level. Electronics processing system 100 may include one or more vacuum ports that are coupled to one or more stations of electronics processing system 100. For example, first vacuum ports 130a may couple factory interface 106 to load locks 120. Second vacuum ports 130b may be coupled to load locks 120 and disposed between load locks 120 and transfer chamber 110.

Electronics processing system 100 may also include a system controller 132. System controller 132 may be and/or include a computing device such as a personal computer, a server computer, a programmable logic controller (PLC), a microcontroller, and so on. System controller 132 may include one or more processing devices, which may be general-purpose processing devices such as a microprocessor, central processing unit (CPU), or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 132 may include a data storage device (e.g., one or more disk drives and/or solid state drives), a main memory, a static memory, a network interface, and/or other components. System controller 132 may execute instructions to perform any one or more of the methodologies and/or embodiments described herein. The instructions may be stored on a computer readable storage medium, which may include the main memory, static memory, secondary storage and/or processing device (during execution of the instructions). System controller 132 may also be configured to permit entry and display of data, operating commands, and the like by a human operator.

FIG. 1 schematically illustrates transfer of an edge ring (or other process kit ring) 136 into a processing chamber 114, 116, 118. According to one aspect of the disclosure, an edge ring 136 is removed from a substrate carrier 122 (e.g., a FOUP) via factory interface robot 126 located in the factory interface 106, or alternatively, is loaded directly into the factory interface 106. Edge rings are discussed herein, but it should be understood that embodiments described with reference to edge rings also apply to other process kit rings and to other replaceable parts or components of processing chambers other than process kit rings. In some embodiments, system controller 132 may determine a transfer recipe for edge ring 136. The transfer recipe may indicate a transfer path that edge ring 136 is to follow while being transported from substrate carrier 122 to a particular processing chamber 114, 116, 118. For example, the transfer recipe may indicate that edge ring 136 is to be moved from aligner station 128 to a particular load lock 120 to processing chamber 116.

Electronics processing system 100 may include an aligner station 128. Aligner station 128 may be housed in factory interface 106. Alternatively, aligner station 128 may be coupled to factory interface 106. Aligner station 128 may be configured to align edge ring 136 to achieve a target orientation of edge ring 136 at a processing chamber 114, 116, or 118. Aligner station 128 may rotate edge ring 136 in a positive or negative yaw-axis direction (e.g., clockwise or counterclockwise) to achieve an initial target orientation of edge ring 136 at aligner station 128. In some embodiments, aligner station 128 may translate edge ring 136 in a positive or negative x-axis and/or y-axis direction to align the edge ring 136 at aligner station 128.

The initial target orientation of edge ring 136 at aligner station 128 may nominally correspond with a target orientation of edge ring 136 at processing chamber 114, 116, or 118. For example, edge ring 136 may include a flat that is to be aligned with a corresponding flat in a substrate support assembly around which the edge ring 136 is to be placed. Failure to accurately place the edge ring 136 at the target orientation in the processing chamber may result in non-uniformities in generated plasma during processing, in uneven wear of the edge ring 136, and/or other problems. In an ideal setup, with no robot position and/or rotation error, no misadjustment of a processing chamber relative to the transfer chamber, etc., edge rings aligned to the initial target orientation at the aligner station should be orientated such that they will ultimately have a target orientation in any processing chamber once placed in that process chamber. However, different robot errors may occur for placement of edge ring 136 in each of the processing chambers. Additionally, one or more of the processing chambers may have a slight misalignment or misadjustment. Embodiments described herein provide a calibration procedure that corrects for any such robot errors, misalignments and/or misadjustments, as is described more fully below.

In one embodiment, the factory interface robot 126 positions the edge ring 136 at a first orientation at aligner station 128. System controller 132 may determine, based on the transfer recipe for the edge ring 136, an alignment recipe to be performed at aligner station 128 to align edge ring 136 to a corrected target orientation. The corrected target orientation may correspond to an initial target orientation at the aligner station 128 as adjusted by a characteristic error value (e.g., a characteristic angular error) associated with the transfer recipe. In one embodiment, the characteristic error value is associated with a particular processing chamber. In one embodiment, the characteristic error value is associated with a particular processing chamber plus a particular load lock chamber. The alignment recipe may include the characteristic error value. In some embodiments, the aligner station 128 may align the edge ring 136 according to the alignment recipe, which may include moving edge ring 136 in at least one a positive or negative x-axis direction, a positive or negative y-axis direction, or a positive or negative yaw-axis direction to properly orient the edge ring 136 to the corrected target orientation at the aligner station 128. The alignment recipe may be associated with the transfer recipe for edge ring 136. In response to aligning edge ring 136 at aligner station, factory interface robot 126 may then retrieve the edge ring 136 from the aligner station 128, the retrieved edge ring 136 having the corrected target orientation, and place edge ring 136 into load lock 120 through a vacuum port 130a with the corrected orientation.

Transfer chamber robot 112 may remove edge ring 136 from load lock 120 through second vacuum port 130b. Transfer chamber robot 112 may move edge ring 136 into the transfer chamber 110, where edge ring 136 may be transferred to a destination processing chamber 114, 116, 118. The edge ring 136 placed in the destination processing chamber 114, 115, 118 may have the target orientation in the processing chamber. Had the edge ring 136 been oriented to the initial target orientation in the aligner station 128, then the edge ring would ultimately have had the characteristic error when placed at the processing chamber. However, since the edge ring 136 was orientated to the corrected target orientation in the aligner station (which may include the initial target orientation minus an angular adjustment corresponding to the characteristic error value), the edge ring 136 placed in the processing chamber has the target orientation in the processing chamber.

While not shown for clarity in FIG. 1, transfer of edge ring 136 may occur while edge ring 136 is positioned on a carrier or adapter, and the end effectors of the robots may pick up and place the carrier or adapter that holds edge ring 136. This may enable an end effector that is configured for handling of wafers to be used to also handle edge ring 136.

Figures 2A, 2B:
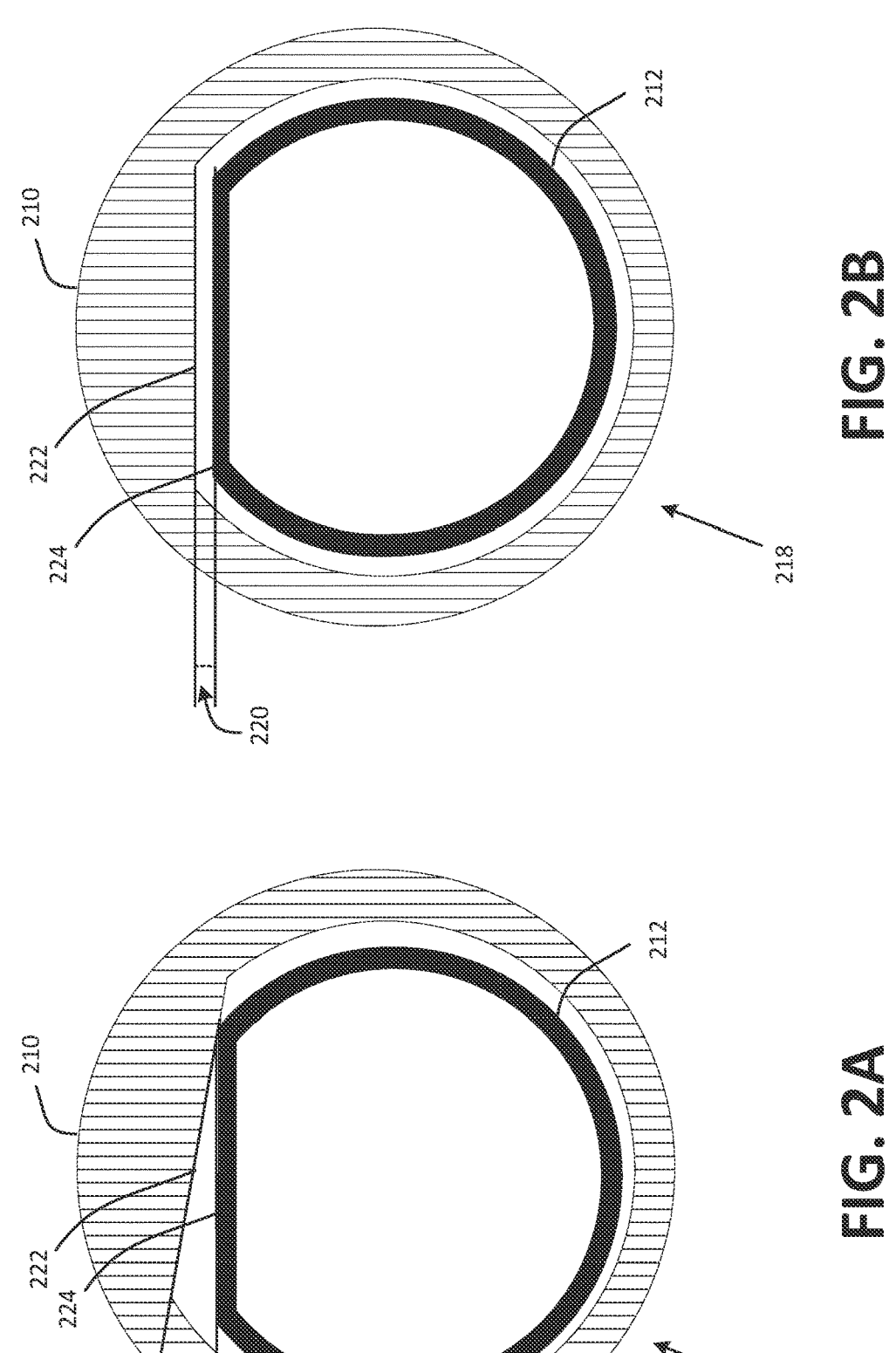
FIGS. 2A and 2B illustrate an example first orientation and an example target orientation of an object at a processing chamber, according to aspects of the present disclosure.

FIGS. 2A and 2B illustrate an example first orientation 216 and an example target orientation 218 of an edge ring 210 at a processing chamber, according to aspects of the present disclosure. The processing chamber may correspond to at least one of processing chamber 114, 116, or 118 of electronics processing system 100 illustrated in FIG. 1. In some embodiments, the processing chamber may include a substrate support assembly 212 configured to support a substrate during a substrate process. Edge ring 210 may be configured for placement around the substrate support assembly 212. As discussed previously, edge ring 210 may be placed by a transfer chamber robot (not shown) at a first orientation 216 at substrate support assembly 212. In some embodiments, first orientation 216 may include an orientation error 220. Orientation error 220 may indicate a difference between an angle of a flat 222 of edge ring 210, relative to an angle of a flat 224 of the substrate support assembly 212. In embodiments, flat 222 is configured to mate with flat 224. The orientation error 220 may be caused by at least a characteristic error associated with the processing chamber. A characteristic error may result from a variety of sources (e.g., error in robot angle and/or positioning, the processing chamber not being installed properly during construction of the processing system, etc.) and may be represented by a characteristic error value. In some embodiments, a transfer recipe may include a combination of characteristic error values, which may be summed to determine a total characteristic error associated with placing an edge ring in a processing chamber. The characteristic error values may account for, for example, a first characteristic error associated with a processing chamber and a second characteristic error associated with at least another station of the electronics processing system (i.e., load lock 120, load port 124, etc.).

As discussed above, orientation error 220 may be determined based on an angle formed between flat 222 and flat 224. In some embodiments, target orientation 218 in the processing chamber may not include orientation error 220 (i.e., there is no difference between the angle of flat 222 and the angle of flat 224).

Figures 3A, 3B:
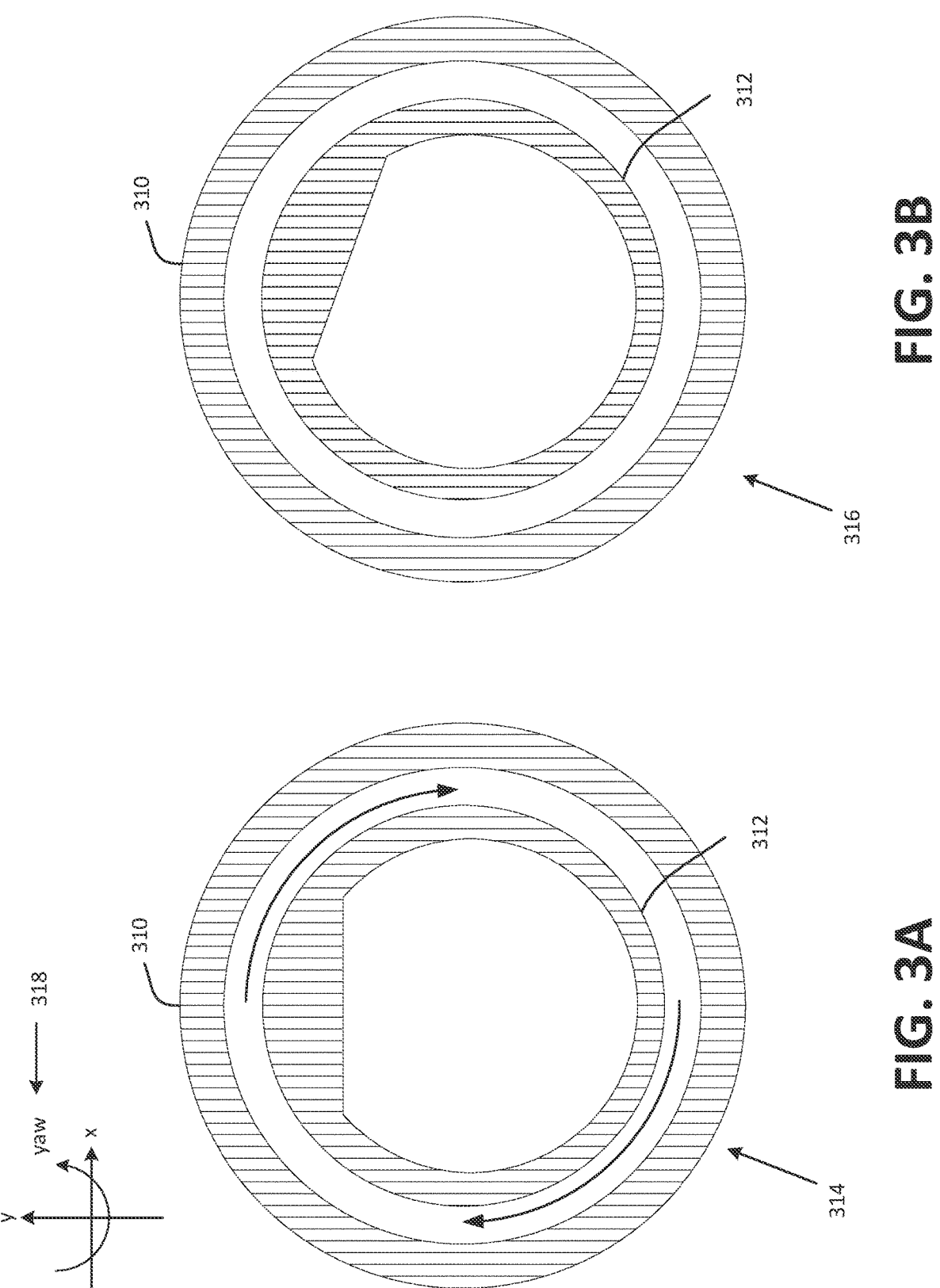
FIGS. 3A and 3B illustrate an example first orientation and an example initial target orientation of an object at an aligner of an electronics processing system, according to aspects of the present disclosure.

FIGS. 3A and 3B illustrate an example initial target orientation 314 and an example corrected target orientation 316 of an edge ring 312 at an aligner station 310 of an electronics processing system, according to aspects of the present disclosure. As discussed previously, edge ring 312 may ordinarily be aligned by aligner station to an initial target orientation 314. The edge ring 312 may initially have some angular error that may occur during placement of the edge ring in a container (e.g., FOUP), transport of the container, and/or attachment of the container to the factory interface. The aligner station may remove such error by aligning the edge ring 312 to the initial target orientation 314. The initial target orientation 314 in an example may include a flat of the edge ring 312 aligned perpendicular to a longitudinal axis of an end effector that picks up the edge ring 312 from the aligner station.

As discussed above, some characteristic error (e.g., angular error) may be introduced to the edge ring 312 by moving the edge ring from the aligner station to a destination processing chamber. Accordingly, the aligner station 310 may intentionally introduce an inverse of the characteristic error into the orientation of the edge ring 312 during the alignment process. The initial target orientation as adjusted by the characteristic error may correspond to a corrected target orientation 316. Accordingly, by introducing the opposite of the characteristic error to the edge ring during alignment that finally placed edge ring in the processing chamber will have no characteristic error, as the intentionally introduced error will cancel out the characteristic error. In some embodiments, aligner 310 may rotate edge ring 312 along a yaw-axis 318 to position edge ring 312 at a the corrected target orientation 316. In some embodiments, aligner 310 may position edge ring 312 at corrected target orientation 316 based on an alignment recipe stored at a controller, such as system controller 132 described with respect to FIG. 1.

As discussed above, stored characteristic error values are used during alignment of edge rings to intentionally introduce orientation error to the edge rings. Each processing chamber may be associated with its own characteristic error value, which may be different from the characteristic error values of other processing chambers. Additionally, each load lock may be associated with its own characteristic error value. Accordingly, an edge ring moved to a first processing chamber through a first load lock may have a different combined characteristic error value than an edge ring moved to the first processing chamber through a second load lock. In order to determine the characteristic error values associated with each processing chamber (and/or each load lock or other station), a calibration procedure may be performed.

Figure 4:
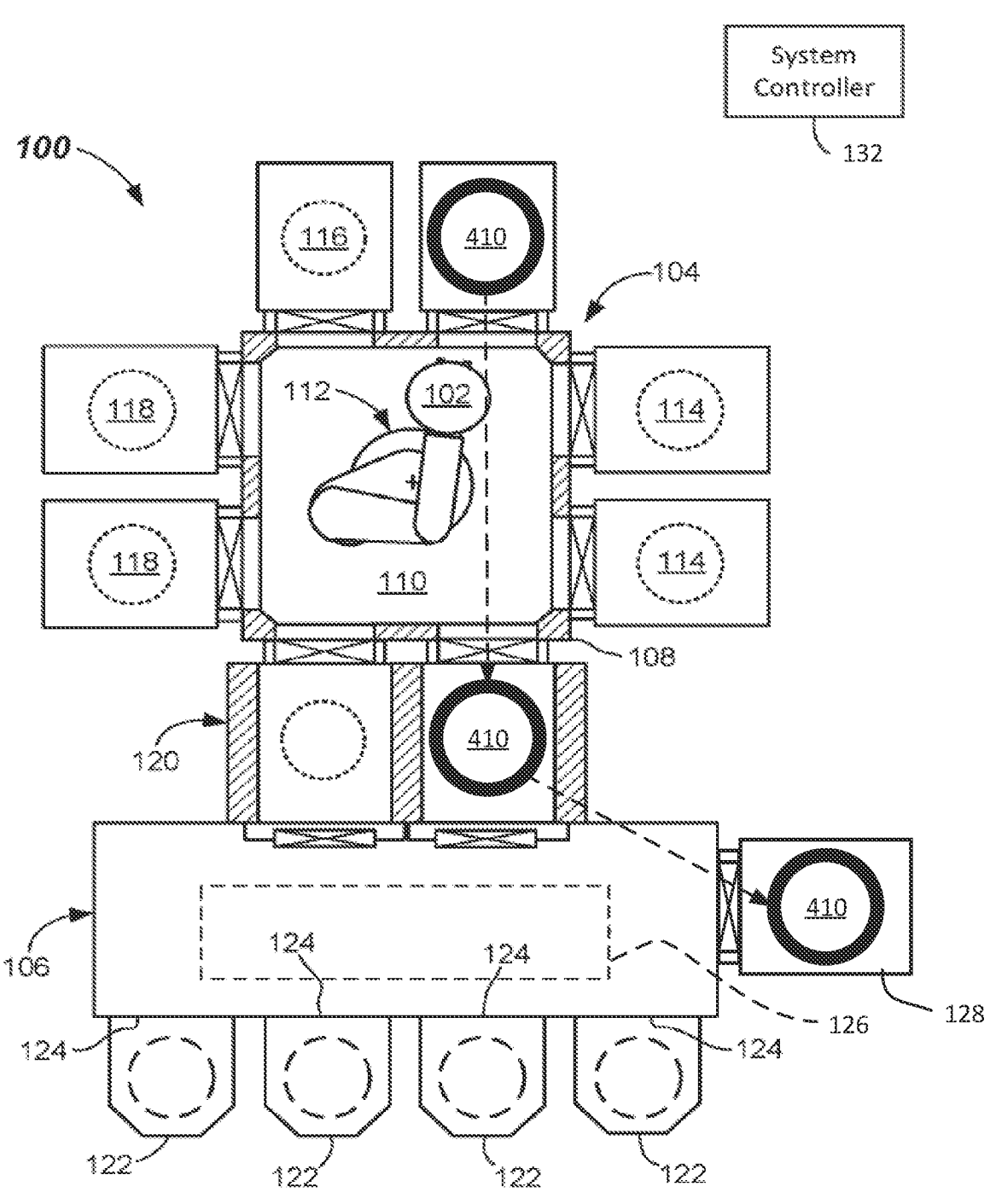
FIG. 4 illustrates a calibration of an aligner station of the example electronics processing system, according to aspects of the present disclosure

FIG. 4 illustrates a calibration of an aligner station 128 of the example electronics processing system 100, according to aspects of the present disclosure. A calibration object 410 may be placed at a target orientation at a processing chamber 114, 116, 118 of electronics processing system 100. A target orientation in the processing chamber may be an orientation of an object (i.e., calibration object 410, substrate 102, etc.) at processing chamber 114, 116, 118 that meets or exceeds a threshold degree of accuracy (i.e., includes an orientation error that exceeds a threshold orientation error). For example, the target orientation may be an orientation of the object that is within a 0.001° of accuracy. In some embodiments, the target orientation in the processing chamber may be the same as target orientation 218 described with respect to FIGS. 2A and 2B.

In some embodiments, calibration object 410 may be at least one of a calibration ring, a calibration wafer, or a standard edge ring (process kit ring). A calibration ring may be a specially designed ring that is configured to fit around a substrate support assembly of the processing chamber 114, 116, 118 such that the calibration ring has a target orientation at the substrate support assembly to within a target degree of accuracy (e.g., 0.0001° of accuracy). Similarly, a calibration wafer may be a specially designed process wafer that is configured to fit within, on, over, or around the support assembly such that the calibration wafer has a target orientation at the substrate support assembly to within the target degree of accuracy or can determine an orientation of the wafer relative to the target orientation to within a target degree of accuracy. In some embodiments, at least one of the calibration ring, the edge ring or the calibration wafer is to be placed, by an operator of the electronics processing system 100, at the processing chamber 114, 116, 118 at the target orientation.

In some embodiments, the substrate support assembly may include one or more coupling components, such as lift pins. The calibration object 410 may include one or more coupling receptacles that are configured to engage with the one or more coupling components of the substrate support assembly. In some embodiments, the one or more coupling receptacles may be kinematic coupling receptacles. In some embodiments, calibration object 410 may be placed at the substrate support assembly in processing chamber 114, 116, 118 by transfer chamber robot 112. Calibration object 410, when placed at the substrate support assembly, may have an orientation error, such as orientation error 220 described with respect to FIGS. 2A and 2B. In response to calibration object 410 being placed at the substrate support assembly, each coupling component of the substrate support assembly may engage with a corresponding coupling receptacle. By each coupling component engaging with a corresponding coupling receptacle, the orientation error associated with calibration object 410 may be removed and calibration object 410 may be positioned at the target orientation. In some embodiments, calibration object 410 may be a calibration wafer.

In some embodiments, calibration object 410 may be a calibration ring composed of a material having a first thermal expansion coefficient and the substrate support assembly may have a second thermal expansion coefficient. In some embodiments the second thermal expansion coefficient of the substrate support assembly may be lower than the first thermal expansion coefficient of calibration object 410. In some embodiments, calibration object 410 may be placed at the substrate support assembly in processing chamber 114, 116, 118 by transfer chamber robot 112. The calibration ring, when placed at the substrate support assembly, may have an orientation error, as illustrated by FIG. 2A. In response to calibration object 410 being placed at the substrate support assembly, an interior of processing chamber 114, 116, 118 may be heated. As a result of the heating of the interior of processing chamber 114, 116, 118, calibration object 410 may expand more than the substrate support assembly, which causes a change in the orientation of calibration object 410 that removes the orientation error. The interior of processing chamber 114, 116, 118 may be cooled, where calibration object 410 may have the target orientation after the cooling.

In some embodiments, calibration object 410 may be a process kit ring that is used during a substrate process at processing chamber 114, 116, 118. The process kit ring may be placed at the substrate support assembly in processing chamber 114, 116, 118 by transfer chamber robot 112. The process kit ring, when placed at the substrate support assembly, may have an orientation error, as discussed with respect to FIGS. 2A and 2B.

After the calibration object 410 is placed at the target orientation at processing chamber 114, 116, 118, calibration object 410 may be retrieved, by transfer chamber robot 112, from processing chamber 114, 116, 118 and placed in a load lock 120 connected to transfer chamber 110. Factory interface robot 126 may retrieve calibration object 410 from load lock 120 and place calibration object 410 at aligner station 128. Calibration object 410 may be placed at aligner station 128 at a first orientation. The first orientation may include a characteristic error associated with the processing chamber.

For example, the first orientation may include an inverse of a characteristic error that would be introduced with an edge ring was aligned to an initial target orientation at the aligner station 128 and then moved to the processing chamber.

In response to calibration object 410 being placed at aligner station 128, a difference between the first orientation and an initial target orientation at the aligner station may be determined. The initial target orientation at the aligner may be an orientation of an object (i.e., calibration object 410, substrate 102) where, in response to the object being transferred from aligner station 128 to a processing chamber 114, 116, 118, the object should nominally be placed at a target orientation upon receipt at processing chamber 114, 116, 118. However, the characteristic error causes the objects that are oriented to the initial target orientation at the aligner station to not have the target orientation at the processing chamber.

The difference between the first orientation and the initial target orientation may indicate a first characteristic error value associated with processing chamber 114, 116, 118 (or an inverse of the characteristic error value associated with the processing chamber 114, 116, 118). The characteristic error value may quantify a characteristic orientation error associated with processing chamber 114, 116, 118. The characteristic error value may be recorded in a storage medium (i.e., a data storage device of system controller 132). In some embodiments, the characteristic error value may be retrieved from the storage medium and used by system controller 132 for alignment of objects to be placed at processing chamber 114, 116, 118 associated with the characteristic error value, as discussed above.

In addition to determining the characteristic error value associated with processing chamber 114, 116, 118, a characteristic error associated with one or more stations (i.e., load lock 120, load port 124, etc.) of the electronics processing system may be determined. For example, calibration object 410 may aligned to a target orientation in a load lock, retrieved, by factory interface robot 126, placed at a second orientation at aligner station 128. A difference between the second orientation and an initial target orientation may be determined. The difference may indicate an orientation error caused by a characteristic error value of load lock 120. The characteristic error value of the load lock may be recorded in the storage medium. In some embodiments, the characteristic error value previously described and the characteristic error value of the load lock may be retrieved from the storage medium and used by system controller 132 for alignment of objects placed at load lock 120 and subsequently placed at processing chamber 114, 116, 118. The same (and/or a similar) process may be performed in order to determine a characteristic error value associated with load port 124. In some embodiments, a single load lock is used for transfer of edge rings to processing chambers. Accordingly, in such embodiments the characteristic error value associated with a processing chamber may also include in it any characteristic error value caused by the single load lock.

In some embodiments, the object may be an edge ring. In response to the calibration performed for the edge ring at aligner station 128, an initial corrected target alignment can be determined. One or more robot arms (e.g., factory interface robot 126 and/or transfer chamber robot 112) may transfer the edge ring to a destination processing chamber 114, 116, 118 and place the edge ring at a target orientation at the processing chamber to a high degree of accuracy. In other or similar embodiments, the object may be a process kit ring. The process kit ring may be retrieved by factory interface robot 126 from a storage location, such as a substrate carrier 122 (e.g., FOUP). The process kit ring may be placed by factory interface robot 126 at aligner station 128. In some embodiments, it may be determined that the process kit ring is to be placed at a particular processing chamber 114, 116, 118. For example, it may be determined that the process kit ring is to be placed at processing chamber 116. In additional embodiments, it may be determined that the process kit ring, prior to being placed at processing chamber 116, is to be placed at a particular load lock 120. In response to determining that process kit ring is to be placed at processing chamber 116 and optionally a particular load lock 120, a first characteristic error value associated with processing chamber 116 and/or a second characteristic error value associated with load lock 120 may be retrieved from the storage medium. The process kit ring may be aligned, using at least the first characteristic error value and the second characteristic error value, to a corrected target orientation. The corrected target orientation may be based on the initial target orientation as adjusted by at least the first characteristic error value and/or the second characteristic error value. In response to the process kit ring being aligned to the corrected target orientation, the process kit ring may be retrieved from aligner station 128 and placed at load lock 120 by factory interface robot 126. The process kit ring may then be retrieved from load lock 120 and placed at processing chamber 116 by transfer chamber robot 112. In some embodiments, the process kit ring may be placed at processing chamber 116 at a target orientation within a degree of accuracy between approximately 0.1° and 0.0000001°. In some embodiments, the process kit ring may be placed at processing chamber 116 at a target orientation within a degree of accuracy between approximately 0.001° and 0.00001°. In some embodiments, the process kit ring may be placed at processing chamber 115 at a target orientation within a 0.00001° of accuracy.

In some embodiments, a distinct characteristic error value may be determined for each processing chamber 114, 116, 118, in accordance with embodiments described above. For example, the first characteristic error value may be associated with processing chamber 116. A third characteristic error value associated with processing chamber 114 may similarly be determined.

Figure 5:
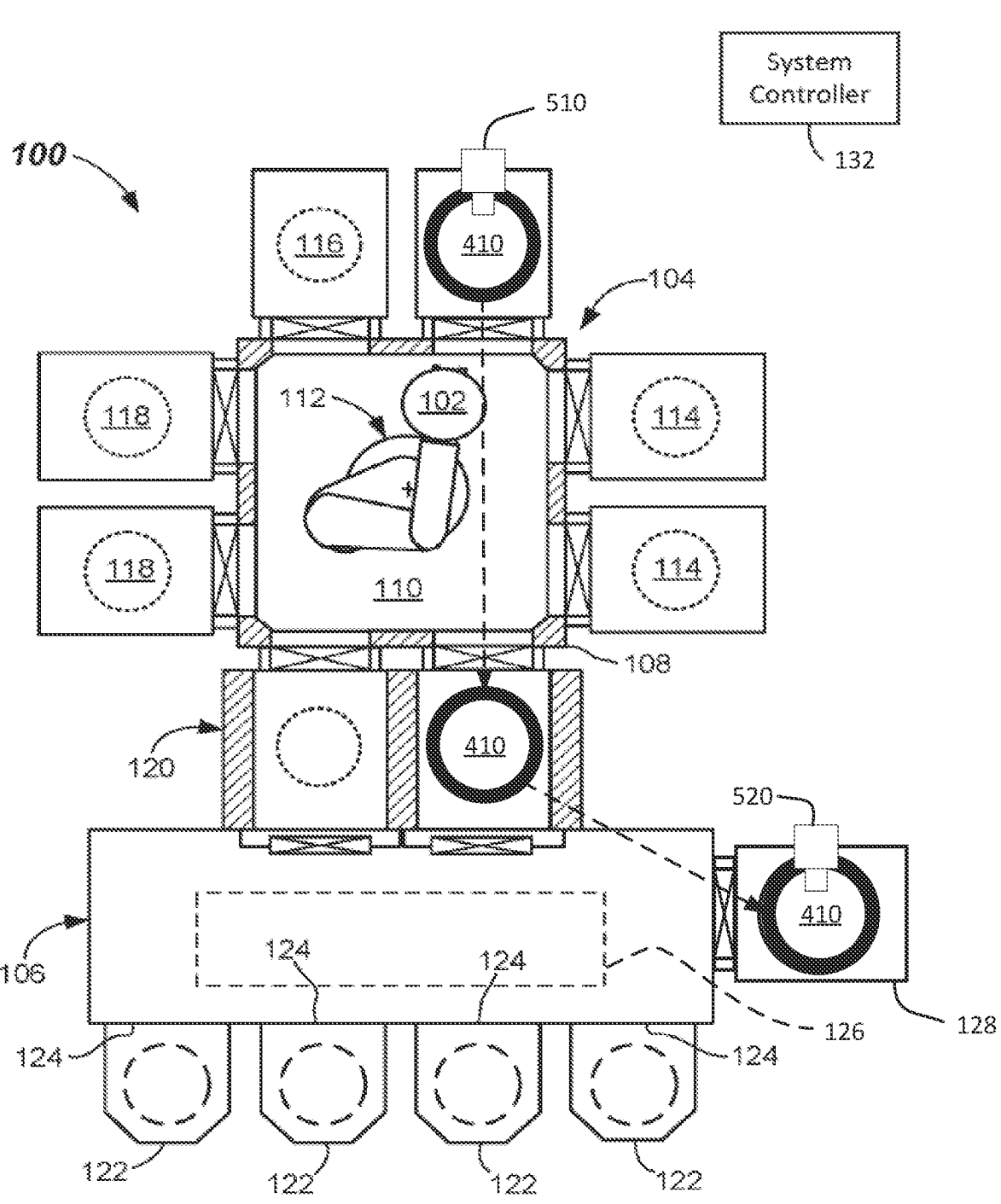
FIG. 5 illustrates another calibration of an aligner station of the example electronics processing system, according to aspects of the present disclosure.

FIG. 5 illustrates another calibration of an aligner station 128 of the example electronics processing system 100, according to aspects of the present disclosure. A calibration object 410 may be placed in a processing chamber 114, 116, 118 of electronics processing system 100. Calibration object 410 may be a process kit ring, a process wafer, or a process kit ring that is used during a substrate process. In some embodiments, calibration object 410 may be placed at a substrate support assembly of processing chamber 114, 116, 118 by an operator of electronics processing system 100. In other embodiments, calibration object 410 may be placed at the substrate support assembly by factory interface robot 126.

In some embodiments, processing chamber 114, 116, 118 may include a first camera 510. First camera 510 may be configured to capture one or more images depicting an orientation of a calibration object placed at the substrate support assembly of processing chamber 114, 116, 118. First camera 510 may be a charge-coupled device (CCD) camera and/or a complementary metal oxide (CMOS) camera. Alternatively, first camera 510 may include an x-ray emitter (e.g., an x-ray laser) and an x-ray detector. In some embodiments, first camera 510 may be a component of calibration object 410. For example, the calibration object may be a camera wafer, and the first camera 510 may be a component of the camera wafer. In some embodiments, aligner station 128 may include a second camera 520. Second camera 520 may be configured to capture one or more images depicting an orientation of an object placed at aligner station 128. Second camera 520 may be a charge-coupled device (CCD) camera and/or a complementary metal oxide (CMOS) camera. Alternatively, first camera 510 may include an x-ray emitter (e.g., an x-ray laser) and an x-ray detector. In some embodiments, at least one of processing chamber 114, 116, 118 or aligner 128 may be opened in order to install first camera 510 or second camera 520, respectively.

First camera 510 may capture a first calibration object image. The first calibration object image may depict a first orientation of the calibration object in processing chamber 114, 116, 118. In response to capturing the first calibration object image, transfer chamber robot 112 may retrieve calibration object 410 from processing chamber 114, 116, 118 and place calibration object 410 at load lock 120. In response to calibration object 410 being placed at load lock 120, calibration object 410 may be retrieved from load lock 120 by factory interface robot 126 and placed at a second orientation at aligner station 128.

A characteristic error value associated with processing chamber 114, 116, 118 may be determined based on the second orientation of calibration object 410 at aligner station 128 and the first orientation depicted in the first calibration object image. The first orientation of calibration object 410 may be determined by performing image processing on the first calibration object image. For example, calibration object 410 may have a known shape and/or include one or more registration features (e.g., a flat, a notch, a fiducial, etc.). The image processing may be performed to determine an orientation of one or more registration features. In some embodiments, a Hough transform may be performed to determine the orientation of the one or more registration features. Using the Hough transform and a prior knowledge of a shape of the object (e.g., a flat on the object), the orientation of the flat can be determined. Other standard imaging processing techniques may be used to determine the orientation of the object, such as edge detection, slope calculation, voting algorithms, the oriented FAST and rotated BRIEF (ORB) image processing technique, and so on.

A first orientation error associated with the first orientation of calibration object 410, depicted in the first calibration object image, may be determined. The first orientation error may be determined by comparing the orientation of the flat determined with respect to the first calibration object image with an orientation of a static component of processing chamber 114, 116, 118, in accordance with embodiments described with respect to FIGS. 2A and 2B.

In some embodiments, a second calibration object image may be captured, by second camera 320 at aligner station 128, depicting the second orientation of calibration object 410 at aligner station 128. The second orientation of calibration object 410 at aligner station 128 may be determined by performing image processing on the second calibration object image, in accordance with previously described embodiments. A second orientation error associated with the second orientation of calibration object 410, depicted in the second calibration object image, may be determined, in accordance with previously described embodiments. A difference between the first orientation error and the second orientation error may be determined. The difference between the first orientation error and the second orientation error may indicate a characteristic error value associated with processing chamber 114, 116, 118. The characteristic error value may be recorded in a storage medium (i.e., a data storage device of system controller 132 or motion controller 134). In some embodiments, the characteristic error value may be retrieved from the storage medium and used by system controller 132 for alignment of objects to be placed at processing chamber 114, 116, 118 associated with the characteristic error value.

In some embodiments, first boundary limits of a set of orientations and a set of positions in processing chamber 114, 116, 118 may be determined. The first boundary limits may indicate a set of one or more orientations of an object at processing chamber 114, 116, 118 that meet a target orientation threshold. Calibration object 410 may be placed at each orientation of the set of orientations and each position of the set of positions. Each orientation of the set of orientations may differ from a target orientation of calibration object 410 at processing chamber 114, 116, 118, For example, calibration object 410 may be placed at a first orientation at processing chamber 114, 116, 118 where a difference between the first orientation and the target orientation is approximately 0.01°. Calibration object 410 may also be placed at a second orientation where a difference between the second orientation and the target orientation is approximately 0.1°. First camera 510 may capture a set of calibration object images where each calibration object image depicts an orientation of the set of orientations and a position of the set of positions.

In some embodiments, each calibration object image may be processed in accordance with previously described embodiments. Based on each processed calibration object image, a set of orientation errors may be determined, where each orientation error corresponds with an orientation of a calibration object depicted in an orientation object image. The first boundary limits may be determined based on the set of orientation errors. The first boundary limits may be used to set an orientation error threshold. The orientation error threshold may indicate an orientation where an object placed at the orientation in processing chamber 114, 116, 118 is incorrectly positioned.

In response to determining the first boundary limits of the set of orientations and the set of positions in processing chamber 114, 116, 118, second boundary limits of a set of orientations and a set of positions in aligner station 128 may be determined. The second boundary limits may indicate a set of orientations of an object at aligner station 128 that meet an initial target orientation threshold (e.g., that will cause an edge ring that falls within the second boundary limits to also fall within the first boundary limits when placed in the processing chamber). The second boundary conditions may be determined by recording a first orientation and/or position (which may be an orientation error and/or position error of zero) of the calibration object in the processing chamber using a first calibration object image, placing the calibration object in the aligner station, and recording a second orientation and/or position of the calibration object at the aligner station using a second calibration object image. Each orientation and/or position may include a corresponding orientation error and/or position error. The first boundary conditions relative to the first orientation and/or position may be known. Accordingly, the second boundary conditions may be mapped around the second orientation and/or position based on the known relationships between the first orientation and/or position and the first boundary conditions.

As used edge rings are removed from processing chambers, they may be placed into aligner station 128, and an orientation and/or position of the used edge rings on the aligner station may be determined. Such an orientation and/or position may then be compared to the second boundary conditions that were associated with the processing chamber. If the orientation and/or position are outside of the second boundary conditions, then a determination may be made that the processing chamber should undergo maintenance and/or an error may be generated.

As discussed previously, in some embodiments, first camera 510 may be a component of calibration object 410. In such embodiments, first camera 510 may capture a first calibration object image depicting a first orientation of calibration object 410 at processing chamber 114, 116, 118, in accordance with previously described embodiments. The first calibration object image may be processed in accordance with previously described embodiments. A first orientation error may be determine based on the processed first calibration object image. The calibration object may be moved to aligner station, and a second calibration object image may be captured by first camera 510 at the aligner station. A second orientation error may be determined based on the processed second calibration object image. A difference between the first orientation error and the second orientation error may be determined. The difference may correspond to a characteristic error value for the processing chamber.

Figure 8:
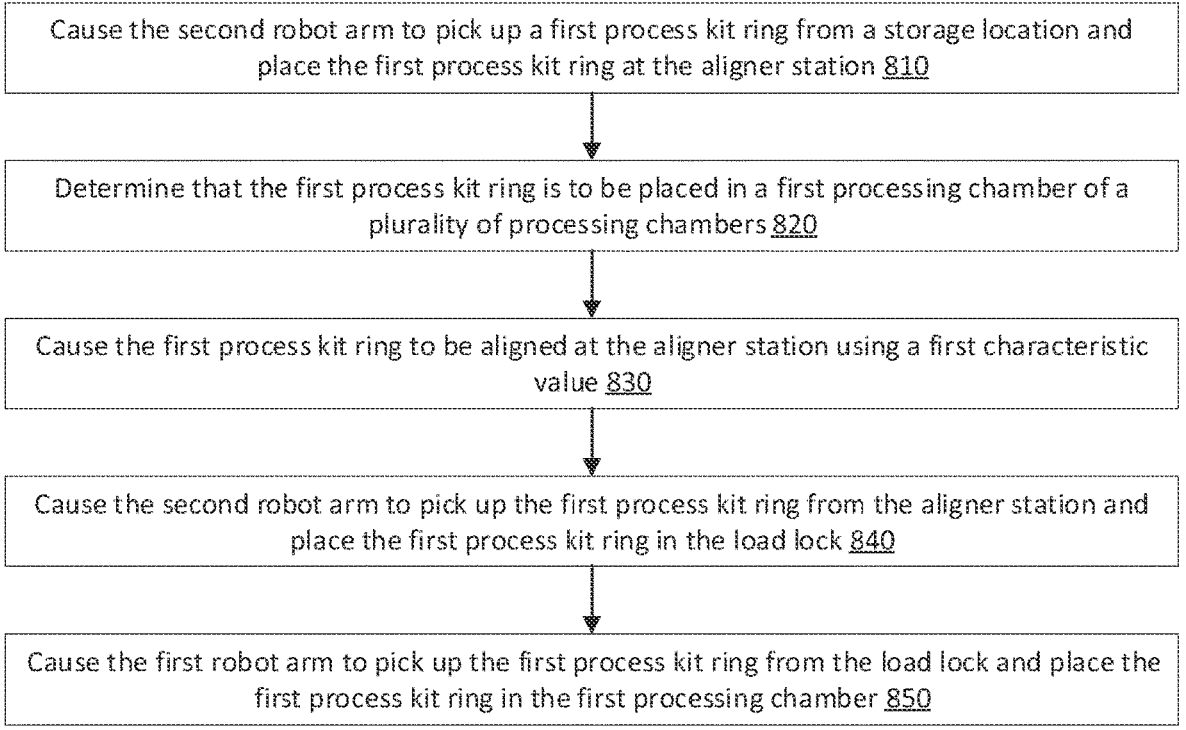
FIG. 8 is another method for calibrating an aligner station of an electronic processing system, according to embodiments of the present disclosure.

FIGS. 6-8 are flow diagrams of various embodiments of methods 600-800 for calibrating an aligner of an electronics processing system. The methods are performed by processing logic that may include hardware (circuitry, dedicated logic, etc.), software (such as is run on a general purpose computer system or a dedicated machine), firmware, or some combination thereof. Some methods 600-800 may be performed by a computing device, such as system controller 132 or motion controller 134 of FIG. 1 that is in control of a robot arm.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

FIG. 6 is a method 600 for calibrating an aligner of an electronics processing system, according to embodiments of the present disclosure. At block 610, a calibration object may be retrieved, by a first robot arm of a transfer chamber, from a processing chamber connected to the transfer chamber. The calibration object may have a target orientation in the processing chamber. In some embodiments, the calibration object may be at least one of a calibration ring, a calibration wafer, or a process kit ring. The calibration object may be placed at the processing chamber in accordance with previously described embodiments. At block 620, the calibration object may be placed, by the first robot arm, in a load lock connected to the transfer chamber. At block 630, the calibration object may be retrieved from the load lock by a second robot arm of a factory interface connected to the load lock.

At block 640, the calibration object may be placed, by the second robot arm, at a first orientation at an aligner station housed in or connected to the factory interface. At block 650, a difference between the first orientation at the aligner station and an initial target orientation at the aligner station may be determined. At block 660, a characteristic error value associated with the processing chamber may be determined. At block 670, the characteristic error value may be recorded in a storage medium. In response to an object being received at the aligner station to be placed at the processing chamber, the characteristic error value may be received from the storage medium. The aligner station may move the object to be positioned at the target orientation based on the characteristic error value.

FIG. 7 is another method for calibrating an aligner station of a processing system, according to embodiments of the present disclosure. At block 710, a calibration object may be placed in a processing chamber. The calibration object may be at least one of a calibration ring, a calibration wafer, or a process kit ring. The calibration object may be placed at the processing chamber in accordance with previously described embodiments. At block 720, a first calibration object image depicting the first orientation of the calibration object may be captured by a first camera in the processing chamber. At block 730, the calibration object may be retrieved from the processing chamber by a first robot arm of a transfer chamber connected to the processing chamber. At block 740, the calibration object may be placed, by the first robot arm, in a load lock connected to the transfer chamber. At block 750, the calibration object may be retrieved from the load lock by a second robot arm of a factory interface connected to the load lock.

At block 760, the calibration object may be placed, by the second robot arm, at a second orientation at an aligner station housed in or connected to the factory interface. At block 780, a characteristic error value associated with the processing chamber may be determined. The characteristic error value may be determined based on the second orientation and the first orientation depicted in the first calibration object image. At block 790, the characteristic error value may be stored in a storage medium. In response to an object being received at the aligner station to be placed at the processing chamber, the characteristic error value may be received from the storage medium. The aligner station may move the object to be positioned at the target orientation based on the characteristic error value.

FIG. 8 is a method for placing a process kit ring at a target orientation at a processing chamber based on a determined characteristic error value associated with the processing chamber, according to embodiments of the present disclosure. At block 810, a controller operatively coupled to a first robot arm, a second robot arm, and an aligner station may cause the second robot arm to pick up a first process kit ring from a storage location and place the first process kit ring at the aligner station. At block 820, it may be determined that the first process kit ring is to be placed in a first processing chamber of a plurality of processing chambers.

At block 830, the controller may cause the first process kit to be aligned, at the aligner station, using a first characteristic error value. The first characteristic error value may be associated with the first processing chamber, in accordance with previously described embodiments. The aligner station may align the first process kit ring to a corrected target orientation that is based on the initial target orientation as adjusted by the first characteristic error value.

At block 840, the controller may cause the second robot arm to pick up the first process kit ring from the aligner station and place the first process kit ring in the load lock. At block 850, the controller may cause the first robot arm to pick up the first process kit ring from the load lock and place the first process kit ring in the first processing chamber. The first process kit ring may be placed in the first processing chamber approximately at a target orientation in the first processing chamber.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:

transferring, by one or more robot arms of a processing system, a calibration ring from a processing chamber of the processing system to an aligner station of the processing system, the calibration ring having a first processing chamber orientation in the processing chamber and a second orientation at the aligner station;

determining a first characteristic error value associated with a transfer path between the processing chamber and the aligner station based on the first processing chamber orientation and the second orientation of the calibration ring at the aligner station; and responsive to detecting, at the aligner station, an object to be transferred to the processing chamber along the transfer path, aligning, by the aligner station, the object to be placed in the processing chamber according to a target processing chamber orientation based on a target aligner orientation as adjusted by the first characteristic error value determined for the transfer path between the processing chamber and the aligner station.

2. The method of claim 1, wherein a substrate support of the processing chamber comprises one or more coupling components, the method further comprising:

placing the calibration ring in the processing chamber by the one or more robot arms, wherein, responsive to the calibration ring being placed at the substrate support in the processing chamber, the one or more coupling components engage with the calibration ring to cause the calibration ring to be placed at the target processing chamber orientation.

3. The method of claim 2, wherein the one or more coupling components comprise one or more lift pins.

4. The method of claim 1, wherein the calibration ring is composed of a material having a first thermal expansion coefficient, and wherein a substrate support of the processing chamber has a second thermal expansion coefficient that is lower than the first thermal expansion coefficient, the method further comprising:

placing the calibration ring around the substrate support in the processing chamber by the one or more robot arms, wherein upon placement of the calibration ring in the processing chamber, the calibration ring has an orientation error associated with the first characteristic error value; and heating an interior of the processing chamber, wherein responsive to the heating the calibration ring expands more than the substrate support, causing a change in orientation of the calibration ring that removes the orientation error; and cooling the interior of the processing chamber, wherein the calibration ring has the first processing chamber orientation in the processing chamber after the cooling.

5. The method of claim 1, further comprising:

capturing, by a camera at the processing chamber, a calibration object image depicting the first processing chamber orientation of the calibration ring in the processing chamber; and determining the first processing chamber orientation of the calibration ring in the processing chamber based on the captured calibration object image.

6. The method of claim 5, further comprising:

capturing, by an additional camera at the aligner station, an additional calibration object image depicting the second orientation of the calibration ring at the aligner station; and determining the second orientation of the calibration ring at the aligner station based on the captured additional calibration object image.

7. The method of claim 1, wherein transferring the calibration ring from the processing chamber to the aligner station comprises:

retrieving, by a first robot arm of a transfer chamber connected to the processing chamber, the calibration ring from the processing chamber;

placing, by the first robot arm, the calibration ring in a load lock connected to the transfer chamber;

retrieving the calibration ring from the load lock by a second robot arm of a factory interface connected to the load lock; and placing, by the second robot arm, the calibration ring at the aligner station, wherein the aligner station is housed in or connected to the factory interface.

8. The method of claim 1, wherein the first processing chamber orientation corresponds to the target processing chamber orientation.

9. A system, comprising:

one or more robot arms;

one or more processing chambers;

an aligner station; and a controller operatively connected to the one or more robot arms and the aligner station, wherein the controller is to:

cause the one or more robot arms to transfer a calibration ring from a processing chamber of the one or more processing chambers to the aligner station, the calibration ring having a first processing chamber orientation in the processing chamber and a second orientation at the aligner station;

determine a first characteristic error value associated with a transfer path between the processing chamber and the aligner station based on the first processing chamber orientation and the second orientation of the calibration ring at the aligner station; and responsive to detecting, at the aligner station, an object to be transferred to the processing chamber along the transfer path, cause the aligner station to align the object to be placed in the processing chamber according to a target processing chamber orientation based on a target aligner orientation as adjusted by the first characteristic error value determined for the transfer path between the processing chamber and the aligner station.

10. The system of claim 9, wherein a substrate support of the processing chamber comprises one or more coupling components, and wherein the controller is further to:

cause the calibration ring to be placed in the processing chamber by the one or more robot arms, wherein, responsive to the calibration ring being placed at the substrate support in the processing chamber, the one or more coupling components engage with the calibration ring to cause the calibration ring to be placed at the target processing chamber orientation.

11. The system of claim 10, wherein the one or more coupling components comprise one or more lift pins.

12. The system of claim 9, wherein the calibration ring is composed of a material having a first thermal expansion coefficient, and wherein a substrate support of the processing chamber has a second thermal expansion coefficient that is lower than the first thermal expansion coefficient, and wherein the controller is further to:

cause the calibration ring to be placed around the substrate support in the processing chamber by the one or more robot arms, wherein upon placement of the calibration ring in the processing chamber, the calibration ring has an orientation error associated with the first characteristic error value; and cause an interior of the processing chamber to be heated, wherein responsive to the heating the calibration ring expands more than the substrate support, causing a change in orientation of the calibration ring that removes the orientation error; and cause the interior of the processing chamber to be cooled, wherein the calibration ring has the first processing chamber orientation in the processing chamber after the cooling.

13. The system of claim 9, wherein the controller is further to:

cause a camera at the processing chamber to capture a calibration object image depicting the first processing chamber orientation of the calibration ring in the processing chamber; and determine the first processing chamber orientation of the calibration ring in the processing chamber based on the captured calibration object image.

14. The system of claim 13, wherein the controller is further to:

cause an additional camera at the aligner station to capture an additional calibration object image depicting the second orientation of the calibration ring at the aligner station; and determine the second orientation of the calibration ring at the aligner station based on the captured additional calibration object image.

15. A non-transitory computer readable storage medium comprising instructions for a server that, when executed by a processing device, cause the processing device to:

cause one or more robot arms to transfer a calibration ring from a processing chamber to an aligner station, the calibration ring having a first processing chamber orientation in the processing chamber and a second orientation at the aligner station;

determine a first characteristic error value associated with a transfer path between the processing chamber and the aligner station based on the first processing chamber orientation and the second orientation of the calibration ring at the aligner station; and responsive to detecting, at the aligner station, an object to be transferred to the processing chamber along the transfer path, cause the aligner station to align the object to be placed in the processing chamber according to a target processing chamber orientation based on a target aligner orientation as adjusted by the first characteristic error value determined for the transfer path between the processing chamber and the aligner station.

16. The non-transitory computer readable storage medium of claim 15, wherein a substrate support of the processing chamber comprises one or more coupling components, and wherein the processing device is further to:

cause the calibration ring to be placed in the processing chamber by the one or more robot arms, wherein, responsive to the calibration ring being placed at the substrate support in the processing chamber, the one or more coupling components engage with the calibration ring to cause the calibration ring to be placed at the target processing chamber orientation.

17. The non-transitory computer readable storage medium of claim 16, wherein the calibration object comprises a calibration wafer, wherein the one or more coupling components comprise one or more lift pins.

* * * * *